United States Patent [19]

Hantke et al.

[11] Patent Number: 4,647,905
[45] Date of Patent: Mar. 3, 1987

[54] IMPROVED PULSE-WIDTH-MODULATION SIGNAL CONVERTER

[75] Inventors: Klaus Hantke; Antonio Brajder, both of Erlangen, Fed. Rep. of Germany

[73] Assignee: Siemens Aktiengesellschaft, Munich and Berlin, Fed. Rep. of Germany

[21] Appl. No.: 749,184

[22] Filed: Jun. 26, 1985

[30] Foreign Application Priority Data

Jun. 29, 1984 [DE] Fed. Rep. of Germany ....... 3424052

[51] Int. Cl.[4] .............................................. H03M 1/00
[52] U.S. Cl. .......................... 340/347 NT; 340/347 A; 340/347 CC; 340/347 M; 324/16 R; 377/42
[58] Field of Search ................. 340/347 NT, 347 CC, 340/347 M; 324/99 D, 78 D, 78 E, 76 A; 377/42

[56] References Cited

U.S. PATENT DOCUMENTS 4,031,532  6/1977  First ............................. 340/347 NT
4,161,724  7/1979  Smutny ....................... 340/347 NT

OTHER PUBLICATIONS

The Engineering Staff of Burr–Brown Research Corp., Operational Amplifiers, 1971, pp. 213–218.

*Primary Examiner*—T. J. Sloyan
*Attorney, Agent, or Firm*—F. W. Powers; J. L. James

[57] ABSTRACT

An improved signal converter which isolates a measurement voltage by converting an analog signal into a pulse-width-modulated output signal. The converter has a first integrator followed in series by a threshold value controller whose output signal actuates at least one reversing switch element which supplies to the summing point of the first integrator at which the signal prevails, and to the threshold value controller, either a positive or negative reference voltage. This signal converter has a very low offset and a high linearity at high sampling rates. The signal also has a second integrator whose summing point is also connected to the signal input and output of the reversing switch element. The output signal of the second integrator is the reference signal of the first integrator. The linearity of the signal converter is thus exclusively dependent upon the parameters of the second integrator. Furthermore, a third integrator is connected in series to the output of the first integrator, with its output signal being superimposed on the reference voltage of the threshold value controller. The symmetry of the converted signal is thus dependent exclusively on the parameters of the third integrator. Even given high common mode interference, the second and third integrators can be built with slow-acting, precision amplifiers.

2 Claims, 4 Drawing Figures

IMPROVED PULSE-WIDTH-MODULATION SIGNAL CONVERTER

BACKGROUND OF THE INVENTION

This invention relates to the field of electronic measurement and more particularly to a measuring circuit utilizing operational amplifiers to convert an analogue signal into a pulse-width modulated signal which can then be transmitted without information loss to a remote unit for measurement. The signal converter has a first integrator whose summing point is connected to the signal input and also connected to the output of a switching element; and which is then connected in series to a threshold value controller whose output signal actuates the switch element, which in turn provides a positive or negative reference voltage to the summing point and the threshold value controller.

A type of signal converter is disclosed in German published patent application No. 2,135,802. Such signal converters are required for the further processing of potential-separated measured values, e.g., measured values of armature current or of rpm set and actual values in drive designs, when there can be no losses in the information content. In that arrangement the signal is converted into a frequency proportional to the measured value and then transmitted without any voltage information change. On the low voltage side, this frequency is again converted into a voltage proportional to the frequency. It has been shown that particularly in cases of high sampling rates the linearity of this known signal converter is inadequate so that an offset equalization is required, at least in order to avoid expensive, rapid-acting, precision amplifiers to realize the integrator.

In is an object of this invention to provide a signal converter of the type specified above possessing adequate linearity utilizing less expensive operation amplifiers.

SUMMARY OF THE INVENTION

Briefly stated in accordance with one aspect of the invention, the foregoing object is achieved by providing a signal converter having a first integrator with a summing point connected to: the signal to be measured as an input, the output of a reversing switch element, and in series with a threshold value controller whose output signal activates a reversing element. The reversing element, depending upon the threshold controller, supplies the first integrator summing point and the threshold controller with a positive or a negative reference voltage. Also connected to the signal input is the summing point of a second integrator. The second integrator summing point is also connected to the output of the reversing switch. The output of this second integrator forms a reference signal for the first integrator.

Since in the design according to this invention a correcting signal is generated by the second integrator which is supplied to the first integrator until it has been assured that the output signal corresponds precisely to the input signal, the linearity of said signal converter is determined exclusively by the parameters of the second integrator.

Preferably, the output of the first integrator is connected to a third integrator whose output signal is superimposed on the reference signal for the threshold value controller. By use of this correcting voltage, the voltage time waveforms in one cycle of the triangular or sawtooth voltage of the first integrator are corrected to the same magnitude so that there is no further necessity for an offset equalization. The symmetry of the triangular voltage of the first integrator is thus exclusively dependent upon the parameters of the third integrator.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings:

DESCRIPTION OF A PREFERRED EMBODIMENT

Figure 1:
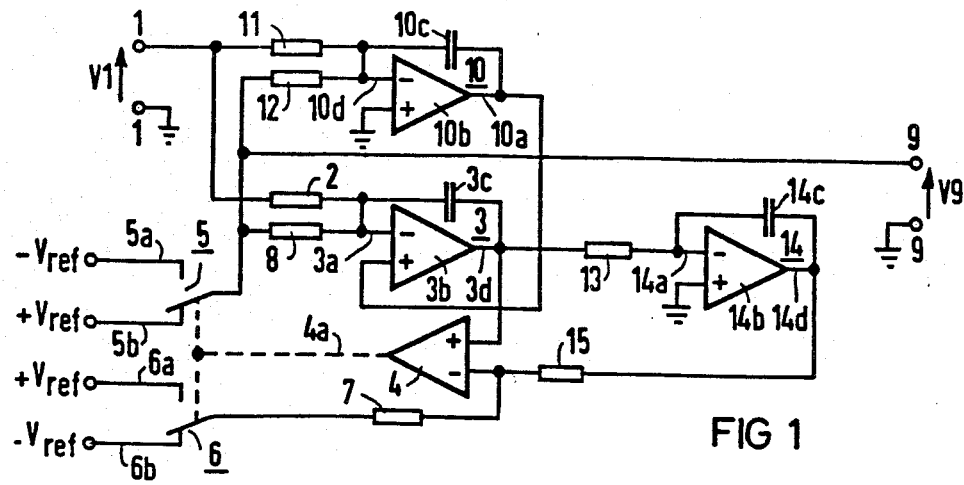
FIG. 1 is a simplified schematic drawing of the signal converter circuit.

The signal $V_1$ is supplied at the input terminals 1 and passes through a resistance 2 to the summing point 3a of a first integrator 3, which in the model is designed with an operation amplifier 3b wired to a capacitor 3c. The output 3d of integrator 3 is connected to the non-inverting input of a threshold controller 4. Output 4a is connected to the actuating inputs of two reversing switch elements 5 and 6 supplied at their alternating contacts 5a and 5b or 6a and 6b by reference voltages $+V_{ref}$ and $-V_{ref}$ preferably of the same magnitude, but with different polarity signs. The output of reversing switch 6 is connected over a resistance 7 to the inverting input of comparator 4, and the output of the reversing switch element 5 is connected over a resistance 8 to the summing point 3a of integrator 3. The output of the reversing switch 5 is, moreover, connected to the terminals 9 at which the pulse width modulated output signal $V_9$ is obtained.

The output 10a of a second integrator 10 is connected to the non-inverting input of integrator 3. Integrator 10 is similarly designed with an operational amplifier 10b, which in normal fashion is wired to a capacitor 10c. The summing point 10d is connected, as in the case of integrator 3, by a resistance 11 to the input terminals 1 and by a resistance 12 to the output of the reversing switch element 5.

The output of integrator 3 is connected in series to the summing point 14a of a third integrator 14 by a resistance 13. Integrator 14 is similarly designed with an operational amplifier 14b which is wired to a capacitor 14c and whose non-inverting input is connected to the reference potential. The output 14d of the integrator 14 is connected by a resistance 15 to the inverting input of the threshold controller 4.

Figure 2:
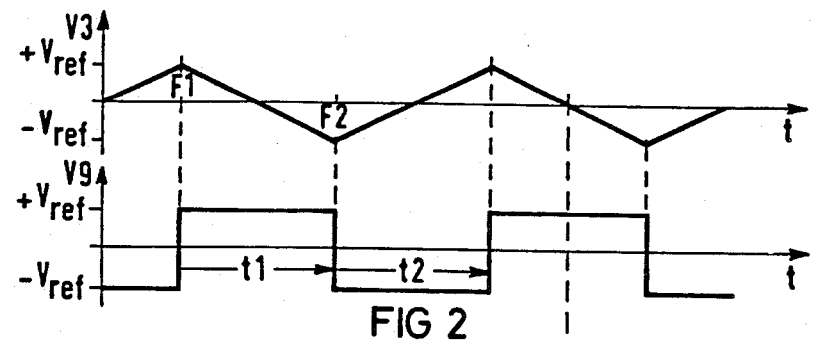
FIG. 2 is a dual plot of integrator voltage, $V_3$, and output voltage $V_9$ as a function of time for $/+V_{ref}/ = /-V_{ref}/$ and $V_1 = 0$.
Figure 3:
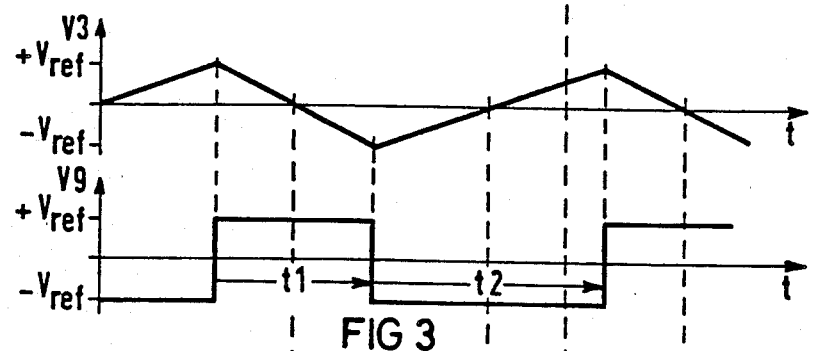
FIG. 3 is a dual plot of integrator voltage, $V_3$, and output voltage, $V_9$, as a function of time for $/+V_{ref}/ = /-V_{ref}/$ and $V_1 > 0$.
Figure 4:
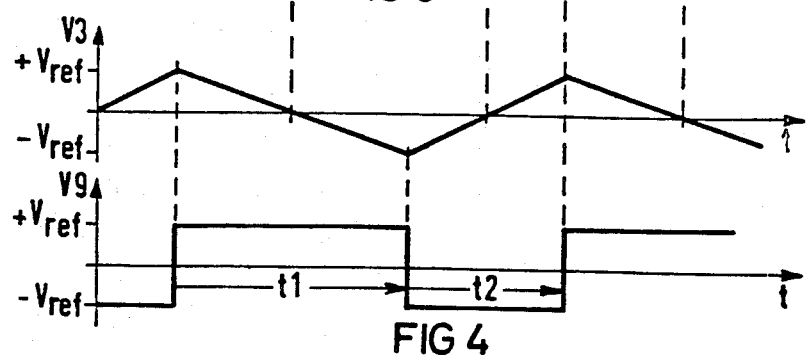
FIG. 4 is a dual plot of integrator voltage, $V_3$, and output voltage, $V_9$, as a function of time for $/+V_{ref}/ = /-V_{ref}/$ and $V_1 < 0$.

The operating principle of the signal converter is further explained by means of FIGS. 2 through 4. These figures plot respectively the output voltage $V_3$ of integrator 3 and the pulse width modulated output voltage $V_9$ of the converter over time period 5, wherein the preferable design is assumed to be $/+V_{ref}/=/-V_{ref}/$. It is further assumed that for FIG. 2 $V_{1ref}=0$, for FIG. 3, $V_1=0+\Delta V_1$, and for FIG. 4, $V_1=0-\Delta V_1$. At time point zero the reversing switch elements 5 and 6 are in the position shown in FIG. 1. Thereby, the voltage $+V_{ref}$ is supplied to the summing point 3a of integrator 3 and reference voltage $-V_{ref}$ supplied to the inverting input of comparator 4. Integrator 3 integrates the voltage prevailing at summing point 3a until its output voltage $V_3$ attains the value $+V_{ref}$. At that point the threshold value controller 4 flips over and reverses the reversing switch elements 5 and 6. Integrator 3 now integrates a negative voltage prevailing at summing point 3a until its output voltage $V_3$ attains the value $-V_{ref}$ at which the comparator 4 again flips over and reversing switch elements 5 and 6 return to the position shown in FIG. 1, and the cycle resumes. Thereby, one obtains the triangular voltage $V_3$ shown in FIG. 2 and the output voltage $V_9$. With the precondition that $/+V_{ref}/=/-V_{ref}/$, the time span $t_1$ in which the integrator 3 integrates downward, equals the time space $t_2$ in which it integrates upwards so that $t_1/t_2=1$. The output voltage alternating between $+V_{ref}$ and $-V_{ref}$ thus has the arithmetic average value of zero ($V_9=0$), which corresponds to the input signal $V_1=0$.

In FIGS. 3 and 4, $V_1>0$ or $V_1<0$. Thus, the time span $t_1$ for the downward integration is different from the time span $t_2$ for the upward integration and $t_1/t_2 \neq 1$. Thereby, $t_1<t_2$ for $V_1>0$ and $t_1>t_2$ for $V_1<0$. The arithmetic average of the output voltage $V_9$ is thus proportional to the input voltage. As the duty cycle of the output voltage $V_9$ is evaluated solely, the clock frequency and thus also the capacitance of capacitor 3c has no effect on the precision of this conversion process.

Particularly in case of high clock frequencies component tolerances can produce transmission errors. In order to compensate for these transmission errors, integrator 10 generates a correcting signal which serves as a reference voltage for integrator 3 and follows it until $V_9=V_1$. Preferably, the time constant selected for that process determined by resistance 11 and capacitor 10c is large relative to the clock frequency. The linearity between the input voltage $V_1$ and the output voltage $V_9$ is thus dependent exclusively on the parameters of amplifier 10b, particularly in those cases when $V_1$ is symmetrical to the reference point.

Integrator 14 generates a correcting voltage which is superimposed on the reference voltage for comparator 4 and thereby shifts the operational amplifier 4 that the voltage-time waveforms $F_1$ and $F_2$ in FIGS. 2 through 4 always remain of the same magnitude. The symmetry of $V_3$ is thus exclusively dependent on the parameters of the operation amplifier 4.

These corrections have a particular impact in case of high sampling rates, e.g., at clock frequencies of 100 kHz required for measurements with high resolution, of 1:10.000 to 1:40.000. Under these requirements it would be necessary with known signal converters to install very rapid-acting, precision amplifiers as the operational amplifiers 3b and 4, which would, no doubt, be very expensive. Conversely, in the circuitry as described the operational amplifiers 10b and 14b can be utilized as slow-acting precision amplifiers, while the operational amplifiers of integrator 3 and threshold value controller 4 could be rapid-acting operational amplifiers whose precision does not have to be excessively high. At a slight expense, therefore, with the circuitry in accordance with this invention achieves a slight offset (e.g., less than 100 micro volts) which requires no equalization while attaining high linearity (e.g., greater than 14 BIT) with high information sampling rates.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. A pulse width modulation signal converter comprising:
   a first integrator with an inverting and a non-inverting input having a first summing point connected to the inverting input;
   an input voltage terminal connected to the first integrator supplying an input signal to the first summing point;
   an output of a reversing switch element connected through a first impedance element to the first summing point;
   a threshold value controller having a non-inverting input connected to an output of the first integrator;
   an output of the threshold value controller switchably controlling the reversing switch element;
   the reversing switch element connecting either a positive reference voltage or a negative reference voltage to the first summing point through the first impedance element and to an inverting input of the threshold value controller through a second impedance;
   a second integrator with an inverting and a non-inverting input having a second summing point connected to the second integrator inverting input;
   the input voltage terminal connects also to the second integrator supplying the input signal to the second summing point;
   the reversing switch element connects either the positive reference voltage or the negative reference voltage to the second summing point through a third impedance element; and
   an output signal of the second integrator connected to the non-inverting input of the first integrator for forming a reference signal therefor.

2. A pulse width modulation signal converter according to claim 1, further comprising:
   a third integrator having an input connected to the output of the first integrator; and
   an output signal of the third integrator is connected to the inverting input of the threshold value controller superimposing the output signal on either the positive reference voltage or the negative reference voltage supplied by the reversing switch element.

* * * * *